US009520266B2

(12) United States Patent
Shirahata et al.

(10) Patent No.: US 9,520,266 B2
(45) Date of Patent: Dec. 13, 2016

(54) PATTERN CRITICAL DIMENSION MEASUREMENT EQUIPMENT AND METHOD FOR MEASURING PATTERN CRITICAL DIMENSION

(71) Applicant: Hitachi High-Technologies Corporation, Minato-ku, Tokyo (JP)

(72) Inventors: Kaori Shirahata, Tokyo (JP); Yasunari Sohda, Tokyo (JP); Makoto Sakakibara, Tokyo (JP); Daisuke Bizen, Tokyo (JP); Hajime Kawano, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 333 days.

(21) Appl. No.: 14/455,878

(22) Filed: Aug. 9, 2014

(65) Prior Publication Data

US 2015/0041648 A1 Feb. 12, 2015

(30) Foreign Application Priority Data

Aug. 9, 2013 (JP) ................................ 2013-165767

(51) Int. Cl.
*H01J 37/244* (2006.01)
*H01J 37/22* (2006.01)
(Continued)

(52) U.S. Cl.
CPC ............ *H01J 37/244* (2013.01); *H01J 37/222* (2013.01); *G01B 2210/56* (2013.01); *H01J 37/10* (2013.01);
(Continued)

(58) Field of Classification Search
USPC ......................................... 250/310, 306, 307
See application file for complete search history.

(56) References Cited

U.S. PATENT DOCUMENTS 7,462,828 B2 12/2008 Fukada et al.
8,153,969 B2 4/2012 Fukada et al.
(Continued)

FOREIGN PATENT DOCUMENTS

JP 2001-110351 A 4/2001
JP 2012-023398 A 2/2012

OTHER PUBLICATIONS

Office Action issue date Sep. 20, 2016 for related Japanese Application No. 2013-165767.

*Primary Examiner* — Kiet T Nguyen
(74) *Attorney, Agent, or Firm* — Miles & Stockbridge P.C.

(57) ABSTRACT

Pattern critical dimension measurement equipment includes an electron source configured to generate a primary electron beam, a deflector configured to deflect the primary electron beam emitted from the electron source, a focusing lens configured to focus the primary electron beam deflected by the deflector, a decelerator configured to decelerate the primary electron beam that irradiates the sample, a first detector located between the electron source and the focusing lens, the first detector being configured to detect electrons at part of azimuths of electrons generated from the sample upon irradiation of the sample with the primary electron beam, and a second detector located between the electron source and the first detector, the second detector being configured to detect electrons at substantially all azimuths of the electrons generated from the sample.

20 Claims, 11 Drawing Sheets

(51) Int. Cl.
*H01J 37/10* (2006.01)
*H01J 37/147* (2006.01)
*H01J 37/28* (2006.01)

(52) U.S. Cl.
CPC .............. *H01J 37/147* (2013.01); *H01J 37/28* (2013.01); *H01J 2237/2448* (2013.01); *H01J 2237/2806* (2013.01); *H01J 2237/2817* (2013.01)

(56) References Cited

U.S. PATENT DOCUMENTS

| | | |
|---|---|---|
| 2003/0122074 A1 | 7/2003 | Suzuki et al. |
| 2006/0243906 A1 | 11/2006 | Fukada et al. |
| 2009/0184255 A1 | 7/2009 | Fukada et al. |
| 2011/0147586 A1* | 6/2011 | Fukuda ................ H01J 37/153 250/310 |

* cited by examiner

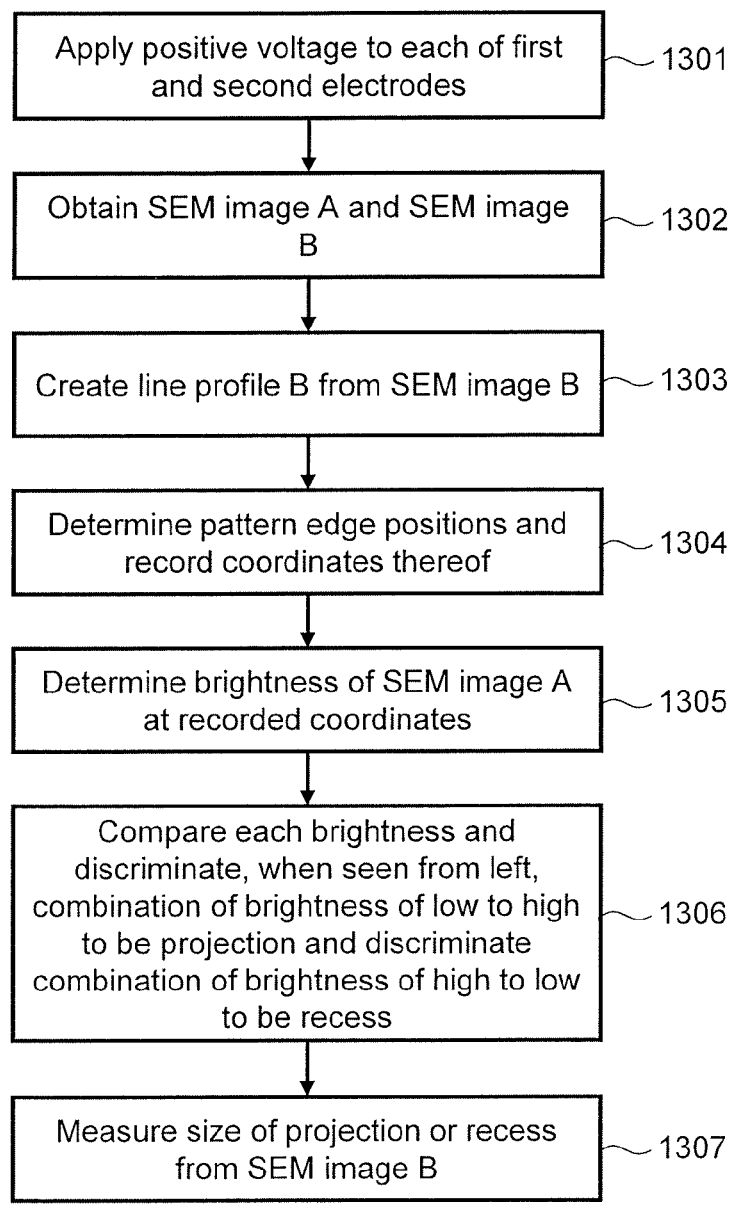

PATTERN CRITICAL DIMENSION MEASUREMENT EQUIPMENT AND METHOD FOR MEASURING PATTERN CRITICAL DIMENSION

CLAIM OF PRIORITY

The present application claims priority from Japanese patent application JP2013-165767 filed on Aug. 9, 2013, the content of which is hereby incorporated by reference into this application.

BACKGROUND

Technical Field

The present invention relates to a pattern critical dimension measurement equipment and a pattern critical dimension measurement method using the same.

Background Art

A scanning electron microscope (SEM) is a type of charged particle beam equipment having a charged particle detection system, and forms an image by detecting signals, such as secondary electrons, generated from a sample when the sample is scanned with an electron beam. SEM is used for various applications. For example, SEM is used to measure the size of a fine circuit pattern, such as a semiconductor device, on a substrate. In addition, equipment that measures the size of a circuit pattern of a semiconductor device using SEM is referred to as a critical dimension SEM, for example.

Nowadays, the sizes of circuit patterns fabricated in a production line of semiconductor devices are measured in each process to improve the production yield of the semiconductor devices. Conventionally, optical microscope-based measurement has often been used for this type of measurement. However, nowadays, in which circuit patterns have been miniaturized, a pattern critical dimension measurement equipment typified by a critical dimension SEM is often used.

However, as the miniaturization of circuit patterns has further advanced, it has become even difficult to discriminate between projections and recesses of a pattern from a SEM image in some cases. FIG. 1 shows a typical example thereof. FIG. 1 shows a SEM image 102 that is obtained by imaging a wafer, which has projections/recesses 101 formed thereon, with a conventional pattern critical dimension measurement equipment, and a line profile 103 thereof. The line profile 103 is a graph obtained by, with respect to each point of the SEM image 102 in the x direction, accumulating the brightness values of the image in the y direction. The pattern critical dimension measurement equipment measures the size of the pattern formed on the wafer on the basis of the line profile 103.

However, the line profile 103 shows no clear difference in brightness between portions corresponding to the projections and portions corresponding to the recesses of the projections/recesses 101, and also shows no difference in brightness between the right and left sides of each pattern edge. Thus, depending on the line profile 103, it would be difficult to discriminate which portion of the SEM image 102 is a projection or a recess.

In order to allow the projections and recesses of the pattern formed on the wafer to be detected from the line profile 103, it would be important to obtain a SEM image with a shadow (i.e., shadow image) equivalent to a shadow that is generated when the projections/recesses 101 are irradiated with light from obliquely above.

FIGS. 2A to 2C illustrate the basic principle to obtain a shadow image. Herein, as shown in FIG. 2A, a case will be described where the surface of a wafer is scanned with a primary electron beam 201. In FIG. 2A, a scanning route 202 of the primary electron beam 201 is indicated by an arrow. Upon irradiation with the primary electron beam 201, secondary electrons A 203 are emitted from the projections/recesses 101. At this time, due to the edge effect, the number of secondary electrons A 203 that are emitted in the left direction is increased on the left side of each projection, while the number of secondary electrons A 203 that are emitted in the right direction is increased on the right side of each projection.

Therefore, the detection counts of secondary electrons A emitted from the projections that are detected by a left detector 204 and a right detector 205 are different. FIGS. 2B and 2C show SEM images obtained with the left detector 204 and the right detector 205, respectively. In FIGS. 2B and 2C, the shadows of the SEM images are enhanced. As shown in FIGS. 2B and 2C, the two SEM images have an opposite relationship of shadows corresponding to projections due to the difference in the detection count of the secondary electrons A 203. As described above, the conventional critical dimension SEM equipment obtains shadow images, which reflect the projections/recesses 101 on the wafer, using the detectors 204 and 205 that are arranged on the right and left sides of the primary electron beam 201.

Patent Document 1, for example, discloses an equipment configuration for obtaining shadow images on the electron source side than on the objective lens side. In Patent Document 1, shadow contrast is obtained by causing secondary electrons, which have been generated from a sample and have passed through an objective lens, to impinge upon a reflector, and detecting secondary electrons generated from the reflector with detectors that are arranged on the right and left sides of the reflector. As described above, using a plurality of detectors can discriminate projections and recesses of a pattern even when an observation object is unknown.

RELATED ART DOCUMENTS

Patent Documents

Patent Document 1: JP 2012-023398 A

SUMMARY

By the way, a pattern critical dimension measurement equipment is required to be able to process a further larger number of wafers per a unit time. In order to improve the throughput, the configuration of the pattern critical dimension measurement equipment is preferably as simple as possible. In addition, the number of components is also desired to be reduced to reduce the cost of the equipment.

When the pattern critical dimension measurement equipment described in Patent Document 1 is studied from the above perspectives, the equipment uses two detectors to discriminate projections and recesses of a pattern, and uses one detector to measure a pattern dimension. That is, the pattern critical dimension measurement equipment described in Patent Document 1 should have a total of three detectors. Such an equipment configuration not only has a large number of components, but also needs a dedicated processing unit to perform image processing and the like. Thus, the cost of such equipment is increased as compared to those of typical pattern critical dimension measurement equipment. At the same time, it is also necessary to newly create a complicated image processing program.

In order to solve the above problems, the present invention adopts the configurations recited in the appended claims, for example. Although this specification contains a plurality of means for solving the above problems, pattern critical dimension measurement equipment in accordance with an example includes an electron source configured to generate a primary electron beam, a deflector configured to deflect the primary electron beam emitted from the electron source, a focusing lens configured to focus the primary electron beam deflected by the deflector, a decelerator configure to decelerate the primary electron beam that irradiates the sample, a first detector located between the electron source and the focusing lens, the first detector being configured to detect electrons at part of azimuths of electrons generated from the sample upon irradiation of the sample with the primary electron beam, and a second detector located between the electron source and the first detector, the second detector being configured to detect electrons at substantially all azimuths of the electrons generated from the sample.

Pattern critical dimension measurement equipment in accordance with another example includes an electron source configured to generate a primary electron beam, a deflector configured to deflect the primary electron beam emitted from the electron source, a focusing lens configured to focus the primary electron beam deflected by the deflector, a decelerator configured to decelerate the primary electron beam that irradiates the sample, a reflector located between the electron source and the focusing lens, the reflector being impinged upon by electrons generated from the sample upon irradiation of the sample with the primary electron beam, a first detector configured to detect electrons generated by the reflector, a first electrode located between the reflector and the first detector, a second electrode located on a side opposite to the first electrode with an optical axis of the primary electron beam interposed therebetween, and a control unit configured to control levels of respective voltages applied to the first electrode and the second electrode, thereby controlling a detection rate of electrons generated by the reflector.

According to the present invention, pattern critical dimension measurement equipment that can discriminate a projection and a recess of a pattern and can measure a pattern dimension can be implemented with a less number of detectors than that of the conventional scheme. Other problems, configurations, and advantageous effects will become apparent from the following description of embodiments.

BRIEF DESCRIPTION OF THE DRAWINGS

FIG. 13 is a flowchart illustrating a method of discriminating a projection and a recess using a SEM image with a low S/N ratio.

DETAILED DESCRIPTION OF THE EMBODIMENT(S)

Hereinafter, embodiments of the present invention will be described with reference to the drawings. It should be noted that the embodiments of the present invention are not limited to those described below, and various variations are possible within the spirit and scope of the present invention.

Embodiment 1

Equipment Configuration

Figure 1:
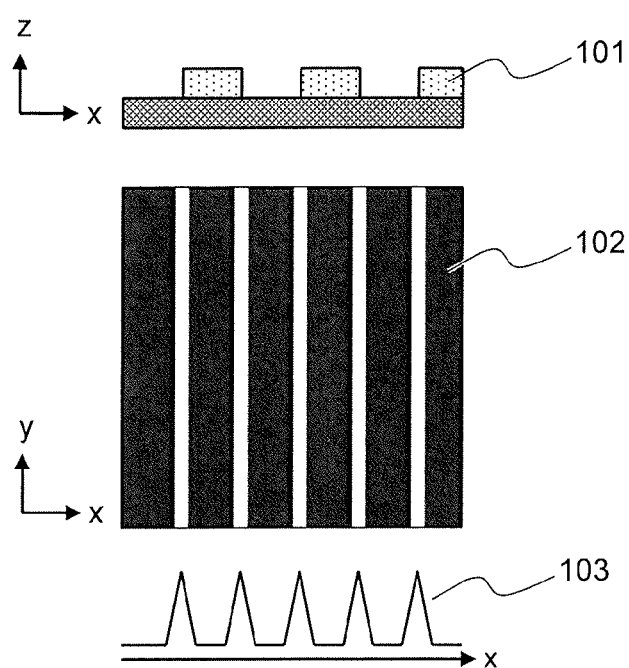
FIG. 1 is a diagram illustrating a SEM image obtained with conventional equipment.
Figure 2A:
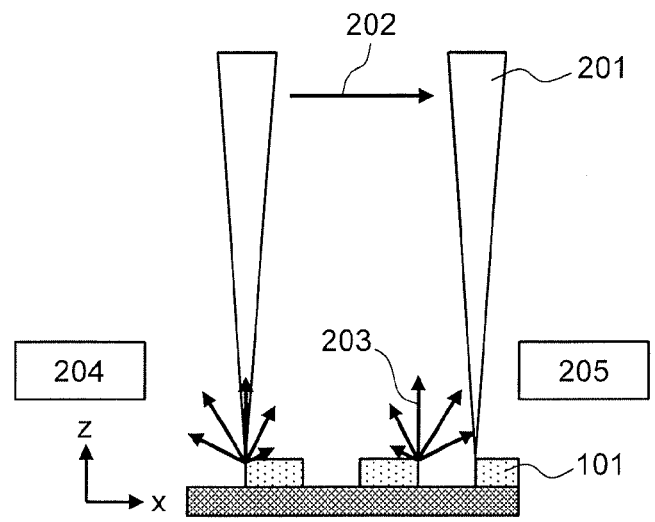
FIGS. 2A to 2C are diagrams illustrating the basic principle of a shadow image.
Figure 2B:
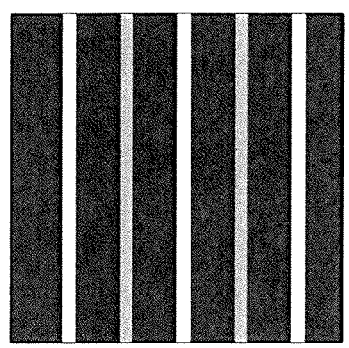
Figure 2C:
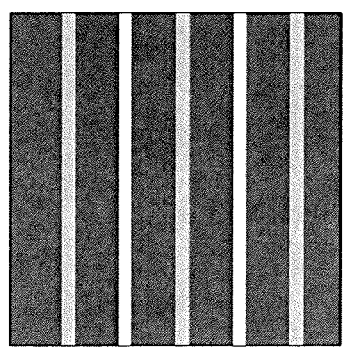
Figure 3:
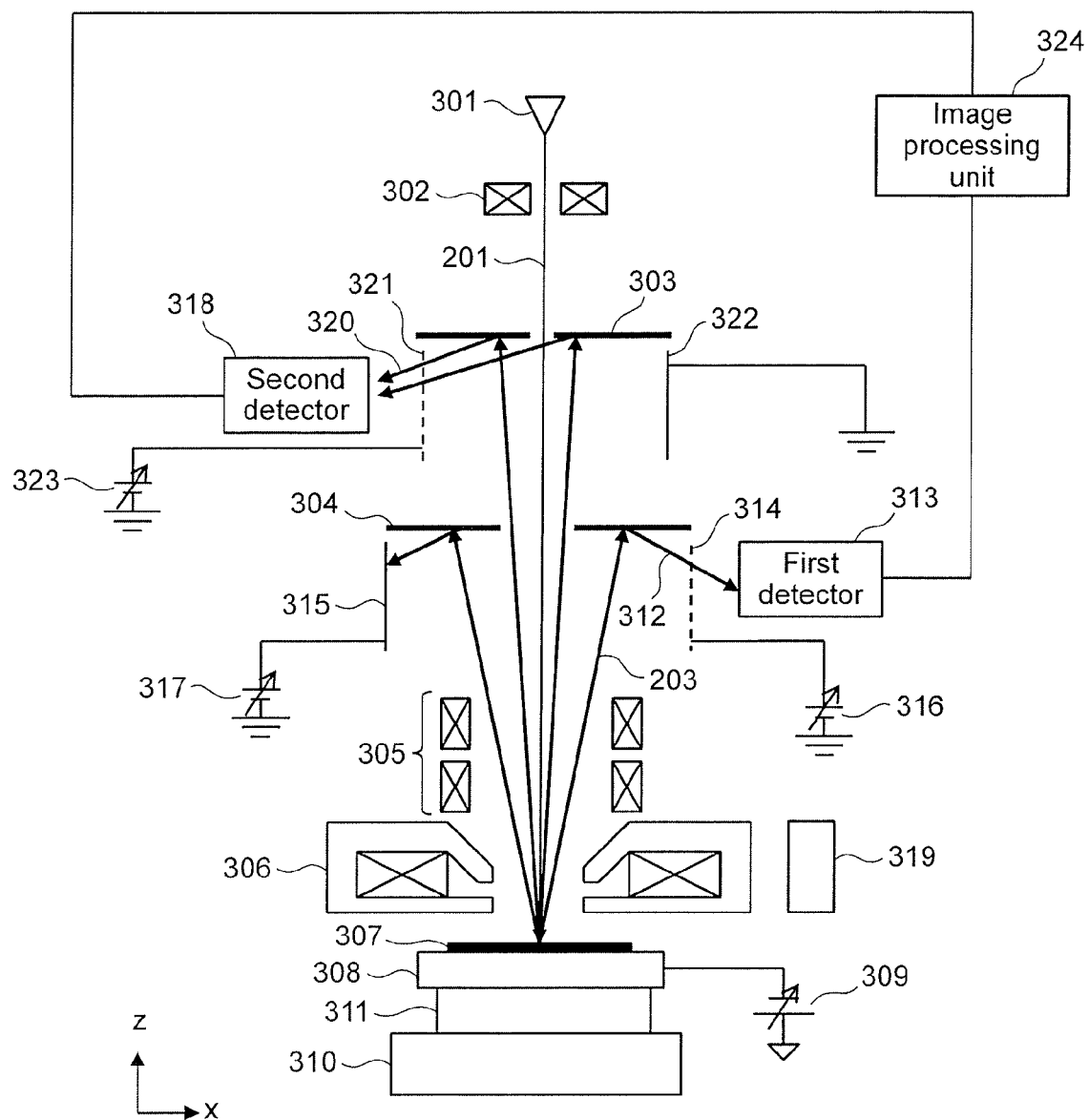
FIG. 3 is a diagram showing the schematic entire configuration of pattern critical dimension measurement equipment in accordance with Embodiment 1.

FIG. 3 shows the schematic configuration of a pattern critical dimension measurement equipment in accordance with this embodiment. In this embodiment, a primary electron beam 201 generated by an electron source 301 passes through an astigmatic aberration corrector 302 for correcting astigmatic aberrations of the primary electron beam, and then sequentially passes through a reflector A 303 and a reflector B 304. Further, the primary electron beam 201 is deflected by a deflector 305 and is sharply focused by an objective lens 306, and then becomes incident on a wafer 307.

The wafer 307 is placed on a plane of a wafer holder 308. The wafer 307 and the wafer holder 308 are electrically in contact with each other. A retarding voltage can be applied to the wafer holder 308 by a retarding power supply 309. When a retarding voltage is applied, the primary electron beam 201 is decelerated by the retarding voltage, and becomes incident on the wafer 307. Hereinafter, the voltage applied by the retarding power supply 309 will be indicated by VR (<0). Provided that the optical axis of the primary electron beam 201 is the z-axis, a stage 310 can move in the xy plane (it should be noted that the y-axis is a direction perpendicular to the paper surface). In addition, the wafer holder 308 and the stage 310 are electrically insulated by an insulator 311.

Secondary electrons A 203 generated upon irradiation of the wafer 307 with the primary electron beam 201 are accelerated upward by the retarding voltage. Some of the secondary electrons A 203 pass through a pore of the reflector B 304, and the others impinge upon the reflector B 304. Thus, secondary electrons B 312 are generated due to the impingement of the secondary electrons A 203 upon the reflector B 304. The secondary electrons B 312 are detected by a first detector 313.

Herein, a first electrode 314 is arranged between the optical axis of the primary electron beam 201 and the first detector 313 (between the reflector B 304 and the first detector 313). Meanwhile, a second electrode 315 is arranged on the side opposite to the first detector 313 with the optical axis of the primary electron beam 201 interposed therebetween. A voltage is applied to the first electrode 314 from an electrode power supply A 316, and a voltage is applied to the second electrode 315 from an electrode power supply B 317. The first electrode 314 has a grid of conductive materials to allow the secondary electrons B 312 to pass therethrough. However, the first electrode 314 may be any electrode as long as it allows the secondary electrons B 312 to pass therethrough and allows a voltage to be applied thereto. Thus, the structure of the first electrode 314 is not limited to the grid.

Herein, if each of the voltages applied to the first electrode 314 and the second electrode 315 is independently controlled, the detection rate of the secondary electrons B 312 can be controlled as follows. For example, a positive voltage can be applied to each of the first electrode 314 and the second electrode 315. In such a case, the secondary electrons B 312 generated on the right side of the reflector B 304 are pulled toward the first electrode 314, and then reach the first detector 313. Meanwhile, the secondary electrons B 312 generated on the left side of the reflector B 304 are pulled toward the second electrode 315, and do not reach the first detector 313. That is, the first detector 313 has a difference between the detection rate of the secondary electrons B 312 generated on the right side of the reflector B 304 and the detection rate of the secondary electrons B 312 generated on the left side of the reflector B 304. Due to such difference in the detection rate, a shadow image is obtained by the first detector 313.

It is also possible to apply a positive voltage to only the first electrode 314 and apply a ground potential or a negative voltage to the second electrode 315. In such a case, both the secondary electrons B 312 generated on the right side of the reflector B 304 and the secondary electrons B 312 generated on the left side of the reflector B 304 are pulled toward the first electrode 314, and then reach the first detector 313. In such a case, the first detector 313 obtains a SEM image of a top view. The application of a voltage to each of the first electrode 314 and the second electrode 315 is controlled by an image processing unit 324 or a control unit (not shown).

Though not shown in FIG. 3, when a voltage is applied to each of the first electrode 314 and the second electrode 315, force that deflects the primary electron beam 201 acts. In order to avoid such deflection, means for generating a magnetic field in a direction that is orthogonal to the direction of a magnetic field, which is generated between the first electrode 314 and the second electrode 315, is arranged in practice. As the means for generating a magnetic field, a method of flowing a current through a coil is adopted, for example. Needless to say, such a method is only exemplary, and thus can be replaced with other methods of generating a magnetic field.

The secondary electrons A 203 that have passed through the pore of the reflector B 304 impinge upon the reflector A 303. Herein, the reflector A 303 is arranged between the electron source 301 and the reflector B 304. Secondary electrons C 320 that are generated due to the impingement of the secondary electrons A 203 upon the reflector A 303 are detected by a second detector 318. Herein, a third electrode 321 is arranged between the reflector A 303 and the second detector 318. In addition, a fourth electrode 322 is arranged on the side opposite to the third electrode 321 with the optical axis of the primary electron beam 201 interposed therebetween.

The second detector 318 detects both the secondary electrons C 320 generated on the right and left sides of the reflector A 303. To this end, a positive voltage is applied to the third electrode 321 from an electrode power supply C 323, and a ground potential is applied to the fourth electrode 322.

It should be noted that similar detection results can be obtained even when a semiconductor detector or a multichannel plate is placed at the position of the reflector A 303, instead of the reflector A 303, the second detector 318, the third electrode 321, the fourth electrode 322, and the electrode power supply C 323.

Besides, an optical microscope 319 for observing a pattern on the wafer 307 is arranged at an off-axis position of the primary electron beam 201 in the pattern critical dimension measurement equipment in accordance with this embodiment. An image that is obtained with the optical microscope 319 will be hereinafter referred to as an optical image.

(Summary of the Pattern Critical Dimension Measuring Operation)

Next, an automatic pattern critical dimension measurement method of the pattern critical dimension measurement equipment in accordance with this embodiment will be described. Automatic pattern critical dimension measurement is divided into a "measurement recipe development flow" performed by an operator, and an "automatic dimension measurement flow" performed using the developed recipe. Each step will be described hereinafter.

[Measurement Recipe Development Flow]

Figure 4:
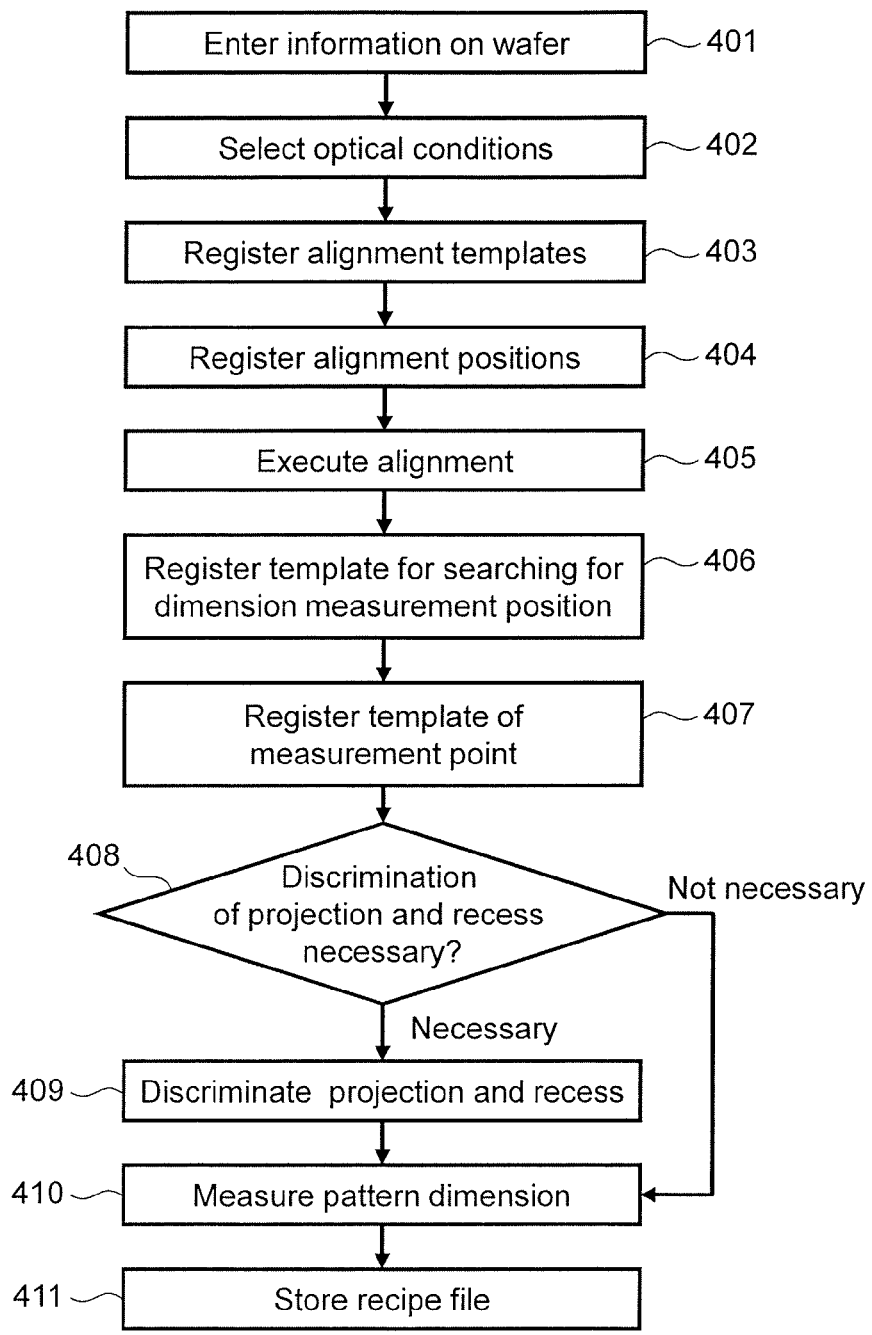
FIG. 4 is a flowchart illustrating a measurement recipe development step that uses the pattern critical dimension measurement equipment.

A measurement recipe development flow will be described with reference to FIG. 4.

(Step 401)

An operator who wants to measure the dimension of a pattern formed on the wafer 307 first enters information on the wafer 307 that is a measurement target. Specifically, the operator enters the wafer size, the chip size, the pattern layout, and the like.

(Step 402)

Next, the operator selects optical conditions for use in the measurement. Parameters of the optical conditions include, for example, the amount of probe current or the level of incident energy of the primary electron beam 201 that becomes incident on the wafer 307, the visual field for capturing an image, and the scanning speed of the primary electron beam 201. When a SEM image is obtained, the optical conditions are determined so that "the quality of an SEM image will not deteriorate through acquisition of images a plurality of times by adding frames and the like" or "extra ordinal contrast such as non-uniform brightness, which can obstruct the pattern size measurement, will not occur." Such operation may be performed by the operator's selecting given optical conditions or by the manufacturer's determining recommendation conditions in shipment of the equipment so that the conditions will be used later.

(Step 403)

Next, the positional relationship between the coordinates of the stage 310 and the coordinates of a pattern on the wafer 307 is accurately measured. The step of measuring such positional relationship will be referred to as an alignment step. Herein, images of a pattern on the wafer 307 that can be recognized on an optical image and on a SEM image are registered as templates. For the templates herein, two types of images that are an optical image and a SEM image can be registered. The template of the optical image is used in a first alignment step, and the template of the SEM image is used in the second alignment step. Typically, the first alignment step with low accuracy and the second alignment step with high accuracy are sequentially performed.

(Step 404)

In order to accurately correct the positional relationship between the coordinates of the stage 310 and the coordinates of a pattern formed on the wafer 307, an alignment step should be performed at least at two places. The places for alignment (alignment positions) are selected by the operator.

(Step 405)

After the alignment positions are registered, the positional relationship between the coordinates of the stage 310 and the coordinates of the pattern on the wafer 307 is measured by comparing the optical image and the SEM image captured at each alignment position with the corresponding templates.

(Step 406)

Next, a position search template for searching for a measurement place around the pattern whose dimension is to be measured is registered. The registration operation is performed in the same way as the operation of registering the alignment templates. Information registered as the template herein is a SEM image with low magnification and the stage coordinates. In the step of searching for a measurement position, a SEM image with low magnification is captured after the wafer is moved to the registered stage coordinates, and then, pattern matching is performed between the captured SEM image and the registered image to determine the measurement position.

(Step 407)

After the template for searching for the dimension measurement position is registered, a template of a dimension measurement point is registered. As a SEM image registered as the template herein, an image with substantially the same magnification as that of a SEM image for measuring the pattern dimension is registered. The operation executed to register the template herein is the same as the operation of registering the alignment templates and the template for searching for the measurement position.

(Step 408)

Next, the operator discriminates if discrimination of a projection and a recess of a pattern is necessary from the template image of the pattern critical dimension measuring point. If the discrimination of a projection and a recess is discriminated to be necessary, the process proceeds to a step of discriminating a projection and a recess (i.e., step 409). The details of the step of discriminating a projection and a recess of a pattern will be described later. Meanwhile, if the discrimination of a projection and a recess is discriminated to be unnecessary, the operator proceeds to a critical dimension measurement step (step 410).

(Step 409)

Herein, the operator discriminates a projection and a recess of the template image.

(Step 410)

After discriminating a projection and a recess of the pattern, the operator measures the pattern dimension. Herein, the operator determines which discrimination of the projection or the recess is to be measured. Meanwhile, if the discrimination of a projection and a recess is discriminated to be unnecessary in step S408, the operator performs a step of measuring the pattern without discriminating the projection and the recess.

(Step 411)

Finally, a recipe file developed through the above steps is stored in a storage unit (not shown, for example, the image processing unit 324), and the series of the recipe development steps thus terminates.

(Detailed Example 1 from the Discrimination of a Projection and a Recess to the Measurement of the Pattern Dimension)

Figure 5:
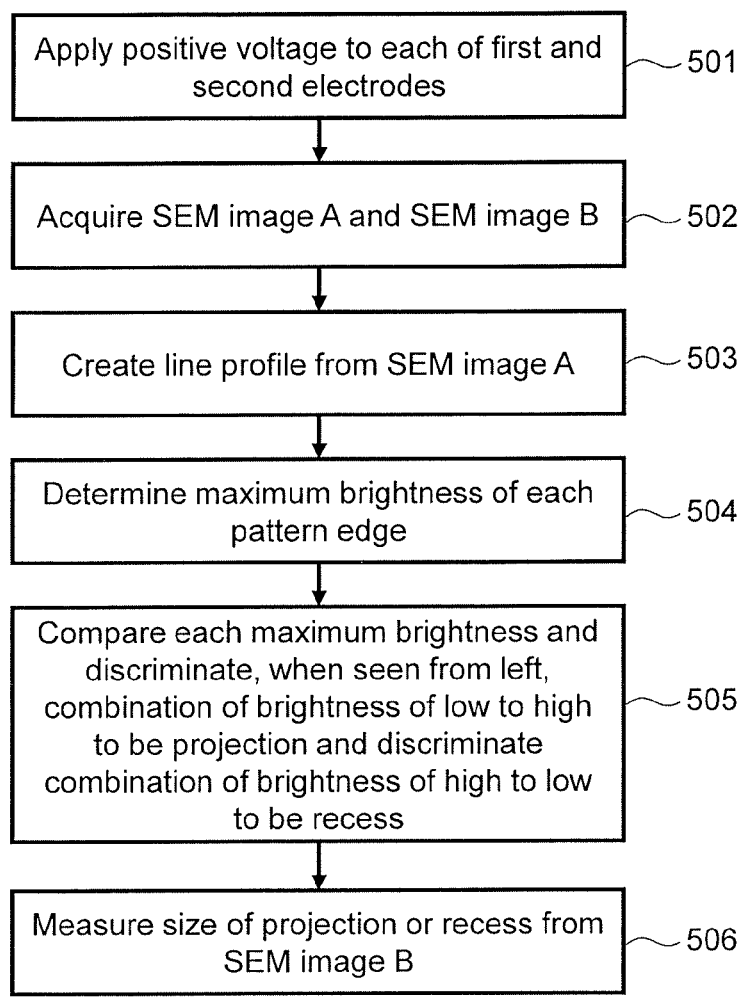
FIG. 5 is a flowchart illustrating the details of the steps of from the discrimination of a projection and a recess to the measurement of the pattern dimension.
Figure 6:
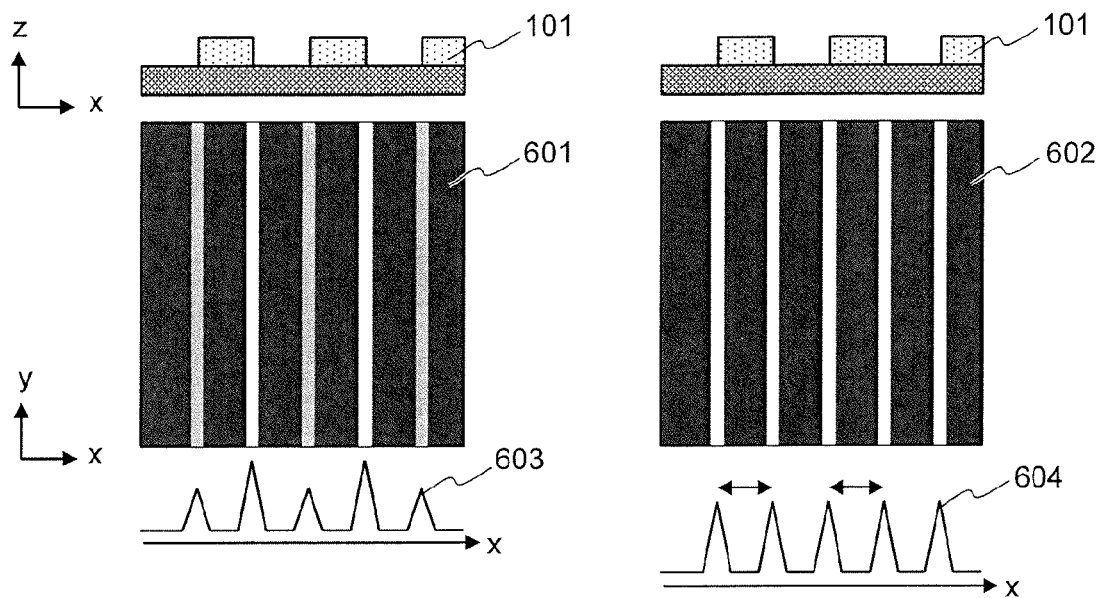
FIG. 6 is a diagram schematically illustrating the steps of from the discrimination of a projection and a recess to the measurement of the pattern dimension.

Herein, the aforementioned steps of from the discrimination of a projection and a recess (step 409) to the measurement of the pattern dimension (step 410) will be described in detail with reference to FIGS. 5 and 6.

(Step 501)

When the operator discriminates that discrimination of a projection and a recess is necessary, the image processing unit 324 or a control unit (not shown) applies a positive voltage to each of the first electrode 314 and the second electrode 315.

(Step 502)

Next, the image processing unit 324 obtains a SEM image at the measurement point. Herein, an image obtained with the first detector 313 will be referred to as a SEM image A 601, while an image obtained with the second detector 318 will be referred to as a SEM image B 602. The SEM image A 601 and the SEM image B 602 are obtained through single scanning of the primary electron beam 201 (that is, concurrently). The image processing unit 324 stores data files of the obtained SEM image A 601 and the SEM image B 602 into a storage unit (not shown, for example, a semiconductor memory, a hard disk drive, or the like).

(Step 503)

Next, the image processing unit 324 accumulates the brightness values of the SEM image A 601 in the y direction to create a line profile A 603. As large amounts of secondary electrons are emitted from edges of the pattern, peaks appear at the edge positions of the pattern as shown in the line profile A 603.

(Step 504)

The image processing unit 324 determines the heights (maximum brightness) of all of the peaks that appear in the line profile A 603.

(Step 505)

In this embodiment, the secondary electrons A 203 emitted on the right side of the pattern are generally detected (as the first detector 313 is arranged on the right side of the optical axis of the primary electron beam 201). Thus, when a pattern with projections and recesses is observed, a difference in peak heights appears as shown in the line profile A 603.

The image processing unit 324 compares the peak heights determined in step 504 to discriminate a portion between two peaks whose heights change from "low" to "high" when seen from the left of the line profile A 603 to be a projection, and discriminate a portion between two peaks whose heights change from "high" to "low" to be a recess.

It should be noted that in the configuration of the pattern critical dimension measurement equipment shown in FIG. 3, when the first detector 313 is arranged on the left side of the optical axis of the primary electron beam 201, the first detector 313 generally detects the secondary electrons A203 emitted on the left side of the pattern. In such a case, in the discrimination of a projection and a recess, the image processing unit 324 discriminates a portion between two edges whose peaks change from "high" to "low" when seen from the left of the line profile A 603 to be a projection, and discriminates a portion between two edges whose peaks change from "low" to "high" to be a recess.

(Step 506)

After the discrimination of the projection and the recess, the image processing unit 324 measures the size of the projection or the recess using the SEM image B 602. The operator discriminates which size of the projection or the recess is to be measured on the basis of the discrimination results in step 505. It should be noted that the SEM image B 602 is created by detecting the secondary electrons A 203 at substantially all azimuths. Therefore, the contrast of the SEM image B 602 is higher than that of the contrast of the SEM image A 601. However, the heights of the peaks that appear in the line profile B 604 of the SEM image B 602 are almost the same, and there is little difference among them.

Herein, the image processing unit 324, using information on the projection and the recess that has been clarified in step 505, measures the size of the target projection or recess with the use of the high-contrast SEM image B 602.

Through the aforementioned processing operations, the image processing unit 324 (i.e., pattern critical dimension measuring equipment) can discriminate a projection and a recess of a pattern and measure the pattern discrimination through single scanning of the primary electron beam 201 with the use of only two detectors that include the first detector 313 and the second detector 318.

[Automatic Dimension Measurement Flow]

Figure 7:
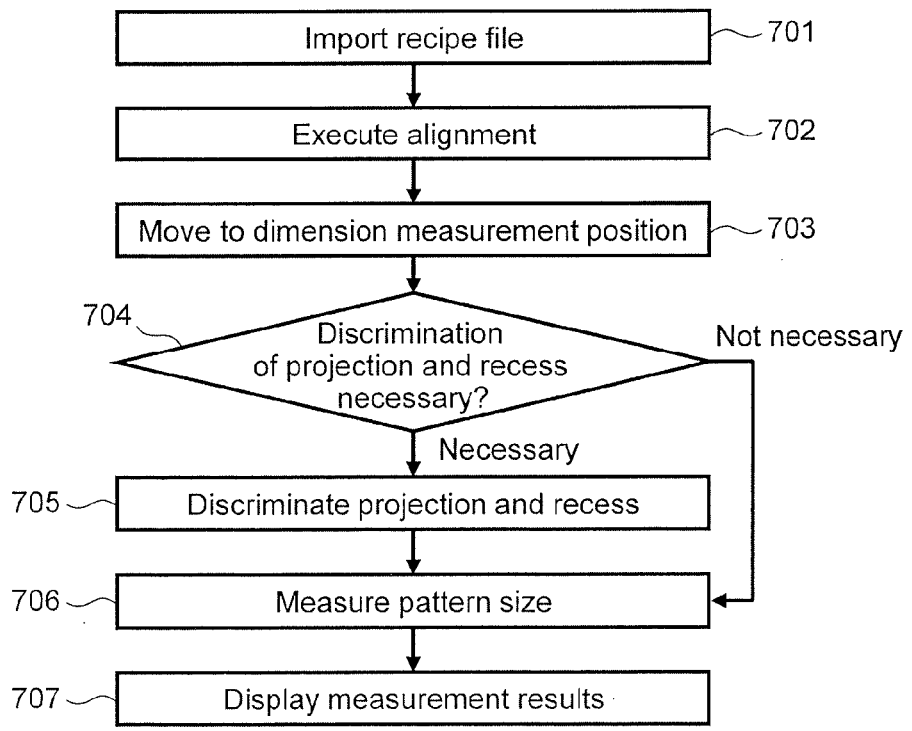
FIG. 7 is flowchart illustrating an auto measurement step using the pattern critical dimension measurement equipment.

The automatic dimension measurement flow will be described with reference to FIG. 7.

(Step 701)

The image processing unit 324 imports a recipe that has been developed and stored in the aforementioned "measurement recipe development flow."

(Step 702)

The image processing unit 324 executes alignment in accordance with information on the stored recipe.

(Step 703)

The image processing unit 324 moves to the dimension measurement position in accordance with information on the stored recipe.

(Step 704)

Next, the image processing unit 324 discriminates if discrimination of a projection and a recess is necessary. If the discrimination of a projection and a recess is necessary in accordance with information on the stored recipe, the process proceeds to step 705, and if the discrimination of a projection and a recess is unnecessary, the process proceeds to step 706.

(Step 705)

If the discrimination of a projection and a recess is necessary, the image processing unit 324 discriminates a projection and a recess of a pattern contained in the SEM image A 601 as in step 505 described above.

(Step 706)

The image processing unit 324 measures the size of the projection or the recess that is designated in the stored recipe.

(Step 707)

Finally, the image processing unit 324 displays the dimension measurement results on a display unit (not shown), and terminates the automatic dimension measurement flow. Through the above steps, the dimension of the pattern can be automatically measured without the need for the operator to perform any operation on the pattern critical dimension measurement equipment.

Conclusion

As described above, when the pattern critical dimension measurement equipment in accordance with this embodiment is used, discrimination of a projection and a recess of a pattern and measurement of the pattern dimension can be implemented through single scanning of the primary electron beam 201 with the use of only two detectors (whereas the conventional scheme needs three detectors) that include the first and second detectors 313 and 318. Consequently, the number of wafers that can be processed per unit time can be increased in comparison with that of the conventional equipment.

In addition, as the configuration of the pattern critical dimension measurement equipment in accordance with this embodiment requires a small number of components, the cost of the equipment can be reduced than that of the conventional equipment. In addition, the pattern critical dimension measurement equipment in accordance with this embodiment can execute discrimination of a projection and a recess of a pattern and measurement of the pattern dimension through single scanning of the primary electron beam 201 as described above. Therefore, pattern critical dimension measurement equipment that causes only small damage of the primary electron beam to a pattern can be implemented.

Embodiment 2

The basic configuration of pattern critical dimension measurement equipment in accordance with this embodiment is the same as the configuration of the pattern critical dimension measurement equipment shown in FIG. 3. However, this embodiment will describe a case where each of the first electrode 314 and the second electrode 315 is divided into a plurality of sub-electrodes. Hereinafter, the reason why the configuration of this embodiment is required will be described.

In the pattern critical dimension measurement equipment with the configuration shown in FIG. 3, the incident energy of the primary electron beam 201 on the wafer 307 can be changed by adjusting the level of the accelerating voltage of the primary electron beam 201 of the electron source 301 or the level of the voltage applied by the retarding power supply 309. When the incident energy of the primary electron beam 201 on the wafer 307 changes, a magnetic field around the objective lens 306 will also change. Consequently, the angle of rotation when the secondary electrons A 203 pass through the objective lens 306 will also change, which in turn will change the impingement position of the secondary electrons A 203 on the reflector B 304.

Figure 8:
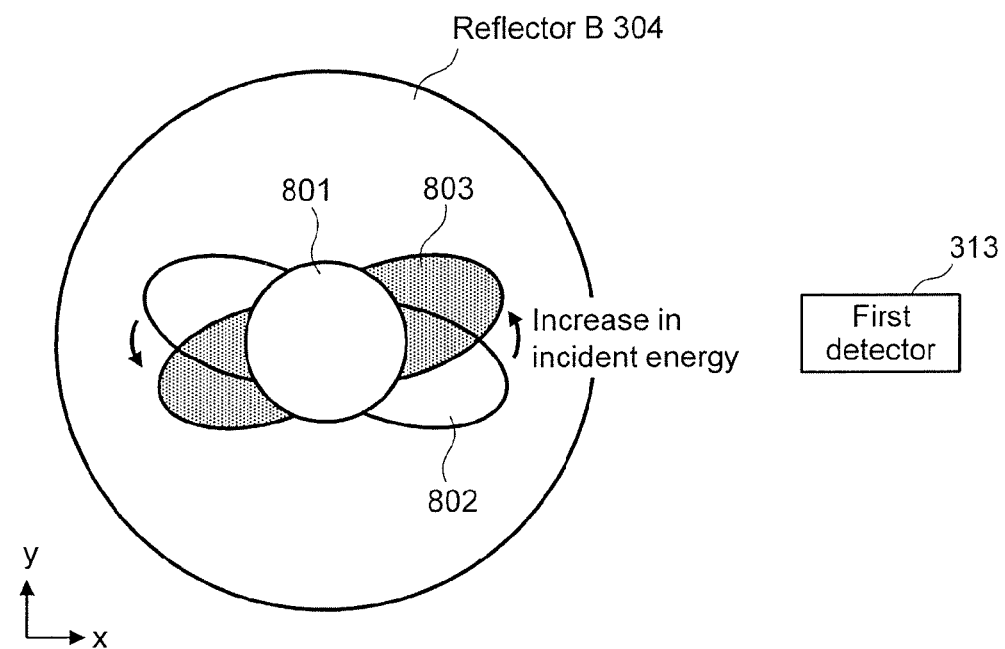
FIG. 8 is a diagram illustrating the difference in impingement position of secondary electrons due to the difference in incident energy level.

The reason why the impingement position will change will be described with reference to FIG. 8. In FIG. 8, an arrival position 802 of secondary electrons on the reflector B 304 when the incident energy level of the primary electron beam 201 is low is represented by a hollow region. Meanwhile, an arrival position 803 of secondary electrons on the reflector B 304 when the incident energy level of the primary electron beam 201 is high is represented by a shaded region.

As shown in FIG. 8, the arrival position 802 of the secondary electrons rotates counterclockwise about a pore 801 formed in the reflector B304 in accordance with an increase in the incident energy level, and changes to the arrival position 803 of the secondary electrons. The angle of rotation herein is greater as the incident energy level of the primary electron beam 201 is higher. That is, the amount of the secondary electrons B 312 detected by the first detector 313 will change in accordance with a change in the incident energy level of the primary electron beam 201, and depending on the level of the incident energy, the peak difference that appears in the line profile A 603 (FIG. 6) becomes small. In such a case, it is difficult to discriminate a projection and a recess.

To avoid the aforementioned technical problem, in this embodiment, each of the first electrode 314 and the second electrode 315 has a plurality of sub-electrodes, and the way to apply a voltage is changed in accordance with the incident energy level of the primary electron beam 201.

Figure 9:
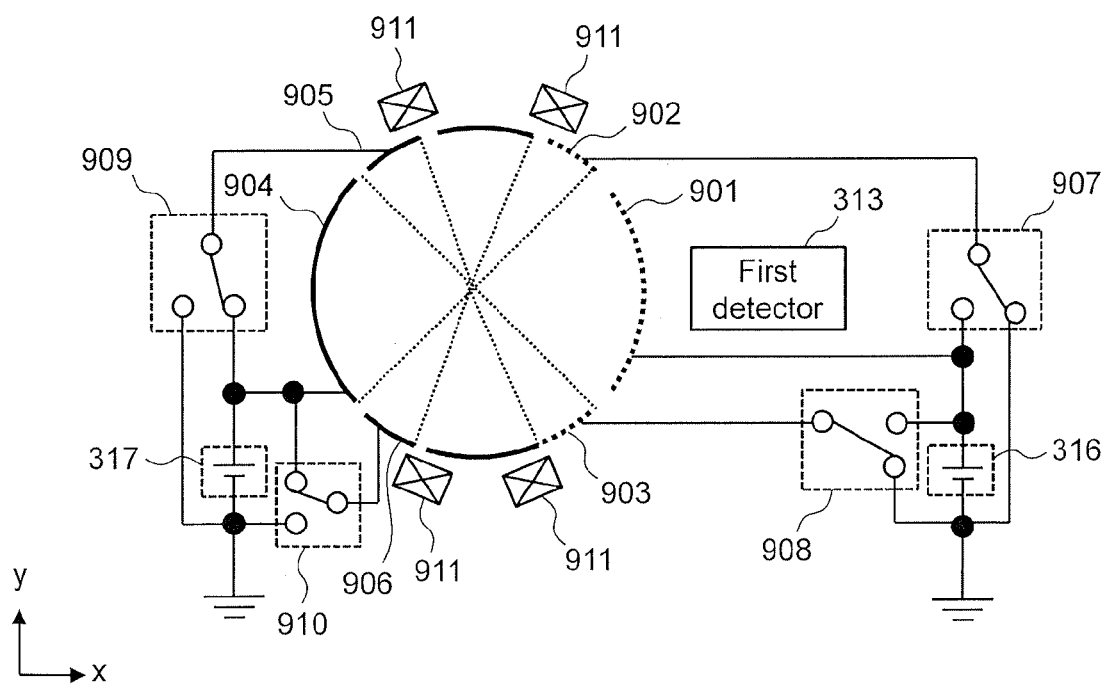
FIG. 9 is a diagram illustrating the configuration of each of a first electrode and a second electrode (a configuration in which each electrode is divided into sub-electrodes) used in the pattern critical dimension measurement equipment in accordance with Embodiment 2.

FIG. 9 shows the configurations of the first electrode 314 and the second electrode 315 used in this embodiment. In this embodiment, each of the first electrode 314 and the second electrode 315 is divided into three sub-electrodes. In FIG. 9, the electrode power supply A 316 is connected to a sub-electrode A901, a sub-electrode B 902, and a sub-electrode C 903 of the first electrode 314. Meanwhile, the electrode power supply B 317 is connected to a sub-electrode A 904, a sub-electrode B 905, and a sub-electrode C 906 of the second electrode 315.

Further, whether to set the voltage applied to the sub-electrode B 902 and the sub-electrode C 903 of the three sub-electrodes of the first electrode 314 and the voltage applied to the sub-electrode B 905 and the sub-electrode C 906 of the three sub-electrodes of the second electrode 315 at a ground potential or not can be selected by a switch A 907, a switch B 908, a switch C 909, and a switch D 910, respectively. Switching of the switches is executed by the image processing unit 324 or a control unit (not shown).

For example, when large amounts of the secondary electrons A 203 impinge upon the first quadrant and the third quadrant on the xy plane of the reflector B 304, it is possible to obtain the SEM image A 601 with the greatest shadow by applying a positive voltage to the sub-electrode A 901 of the first electrode 314, the sub-electrode B 902 of the first electrode 314, the sub-electrode A 904 of the second electrode 315, and the sub-electrode C 906 of the second electrode 315.

Meanwhile, when large amounts of the secondary electrons A 203 impinge upon the second quadrant and the fourth quadrant on the xy plane of the reflector B 304, it is possible to obtain the SEM image A 601 with the greatest shadow by applying a positive voltage to the sub-electrode A 901 of the first electrode 314, the sub-electrode C 903 of the first electrode 314, the sub-electrode A 904 of the second electrode 315, and the sub-electrode B 905 of the second electrode 315.

It should be noted that to which electrode a voltage should be applied in accordance with the incident energy level of the primary electron beam 201 is set in advance by the manufacturer of the equipment. Needless to say, it may be individually adjusted by the user.

By the way, when the method for applying a voltage to the sub-electrode A 901, the sub-electrode B 902, and the sub-electrode C 903 of the first electrode 314 and to the sub-electrode A 904, the sub-electrode B 905, and the sub-electrode C 906 of the second electrode 315 is changed, an electric field on the optical axis of the primary electron beam 201 will change. Therefore, if no measure is taken, the deflection direction of the primary electrons will also change in accordance with a change in the voltage application method.

Thus, in this embodiment, the amount of current that is flowed through ExB coils 911 is changed in conjunction with the change of the method for applying a voltage to the sub-electrode A 901, the sub-electrode B 902, and the sub-electrode C 903 of the first electrode 314 and to the sub-electrode A 904, the sub-electrode B 905, and the sub-electrode C 906 of the second electrode 315, so that an electric field and a magnetic field on the optical axis are adjusted to always avoid deflection of the primary electron beam 201.

Further, when the method for applying a voltage to the sub-electrode A 901, the sub-electrode B 902, and the sub-electrode C 903 of the first electrode 314 and to the sub-electrode A 904, the sub-electrode B 905, and the sub-electrode C 906 of the second electrode 315 is changed, the amount of astigmatic aberrations will also change. Thus, in this embodiment, the preset value of the astigmatic aberration corrector 302 is also changed in conjunction with the change of the method for applying a voltage to the sub-electrode A 901, the sub-electrode B 902, and the sub-electrode C 903 of the first electrode 314 and to the sub-electrode A 904, the sub-electrode B 905, and the sub-electrode C 906 of the second electrode 315 so that the amount of astigmatic aberrations of the primary electron beam 201 becomes minimum.

Embodiment 3

The basic configuration of the pattern critical dimension measurement equipment in accordance with this embodiment is the same as the configuration the pattern critical dimension measurement equipment shown in FIG. 3. However, in regard to the pattern critical dimension measurement equipment in accordance with this embodiment, a case where the pore diameter of the reflector B304 is made variable will be described. Hereinafter, the reason why the configuration of this embodiment is required will be described.

In the pattern critical dimension measurement equipment with the configuration shown in FIG. 3, when discrimination of a projection and a recess of a pattern and measurement of the pattern dimension are performed, if the amount of the secondary electrons A 203 that pass through the reflector B 304 is large, the S/N ratio (Signal-to-Noise Ratio) of the SEM image B 602 for use in the measurement of the pattern dimension will increase, whereas the S/N ratio of the SEM image A 601 for use in the discrimination of a projection and a recess will decrease. In such a case, the contrast of the SEM image B 602 for use in the measurement of the pattern dimension will also increase, whereas the contrast of the SEM image A 601 for use in the discrimination of a projection and a recess will decrease.

Conversely, if the amount of the secondary electrons A 203 that pass through the reflector B 304 is small, the S/N ratio of the SEM image B 602 will decrease, whereas the S/N ratio of the SEM image A 601 will increase. In such a case, the contrast of the SEM image A 601 for use in the discrimination of a projection and a recess will increase, whereas the contrast of the SEM image B 602 for use in the measurement of the pattern dimension will decrease.

Herein, the pattern critical dimension measurement equipment is, first of all, required to measure the pattern size with high accuracy. Thus, it would be desirable to improve the S/N ratio of the SEM image B 602 as high as possible while ensuring the minimum S/N ratio for the SEM image A 601 that allows discrimination of a projection and a recess.

Figure 10:
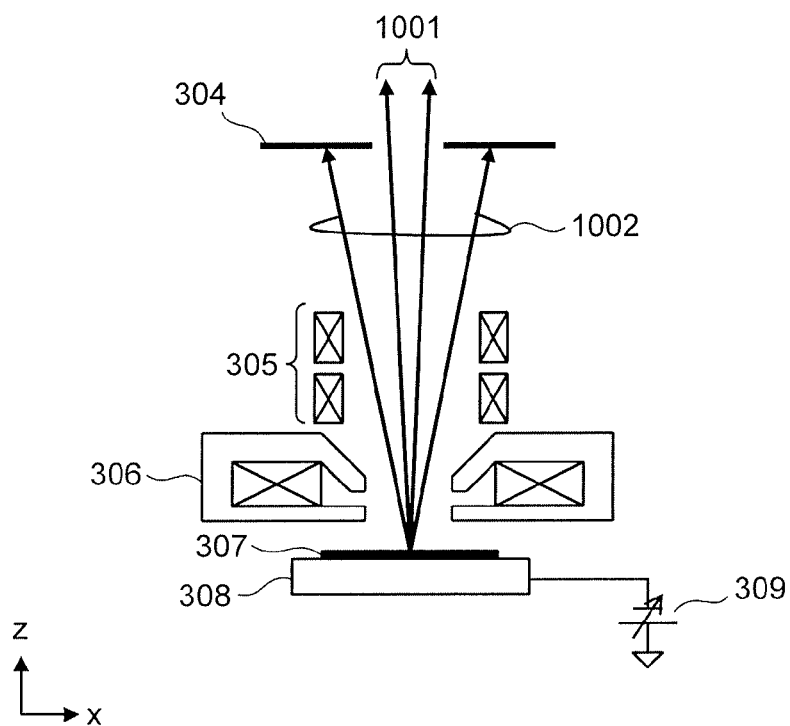
FIG. 10 is a diagram illustrating the difference (rotation) in trajectory between "real" secondary electrons and backscattered electrons.

Herein, as shown in FIG. 10, the secondary electrons A203 can be divided into "real" secondary electrons 1001 with energy that is less than or equal to 50 [eV] and backscattered electrons 1002 with energy having about the same level as the incident energy of the primary electron beam 201. The "real" secondary electrons 1001 reflect the shape of the pattern surface, and thus are adapted to the measurement of the pattern dimension. Meanwhile, contrast that reflects the difference in patterning materials is obtained from the backscattered electrons 1002.

As the "real" secondary electrons 1001 and the backscattered electrons 1002 differ in energy level, most of such electrons can be separated from each other based on the difference in trajectory. Specifically, as shown in FIG. 10, the "real" secondary electrons 1001 are concentrated around the optical axis as the energy level is low, whereas the trajectory of the backscattered electrons 1002 is likely to widen as the energy level is high. Thus, the two types of electrons can be discriminated if an appropriate pore diameter of the reflector B 304 is selected.

This embodiment will describe a method for forming the SEM image B 602 for use in the measurement of the pattern dimension using the "real" secondary electrons 1001 and forming the SEM image A 601 for use in the discrimination of a projection and a recess using the backscattered electrons 1002.

Figure 11:
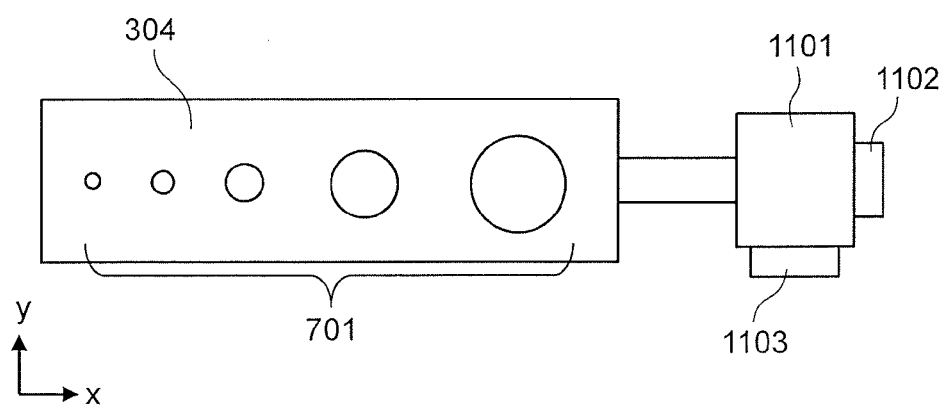
FIG. 11 is a diagram illustrating the configuration of a reflector with different pore diameters.

The trajectory of the "real" secondary electrons 1001 and the trajectory of the backscattered electrons 1002 will change depending on the magnetic field around the objective lens 306 or the retarding voltage. In order to select an optimum pore diameter of the reflector B 304 under each condition, a reflector B 304 having a plurality of pores with different diameters is prepared as shown in FIG. 11. Switching of the pore diameter is performed by a pore diameter switching mechanism 1101. Fine adjustment of the center position of the pore is performed by an x-direction fine adjustment mechanism 1102 and a y-direction fine adjustment mechanism 1103. Through the fine adjustment, the center of the pore is aligned with the optical axis of the primary electron beam 201. Such switching and fine adjustment are performed by the image processing unit 324 or a control unit (not shown).

It should be noted that a mechanism for making the pore diameter of the reflector B304 variable is not limited to the configuration disclosed in this embodiment. For example, an iris diaphragm used in an optical camera, which is formed by overlaying a plurality of plates on one another, may also be used. Even when such diaphragm mechanism is adopted, it is possible to obtain a similar advantageous effect to that of the sliding variable mechanism shown in FIG. 11.

Figure 12A:
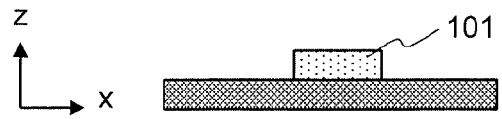
FIGS. 12A to 12D are diagrams illustrating a method of determining the pore diameter of a reflector.
Figure 12B:
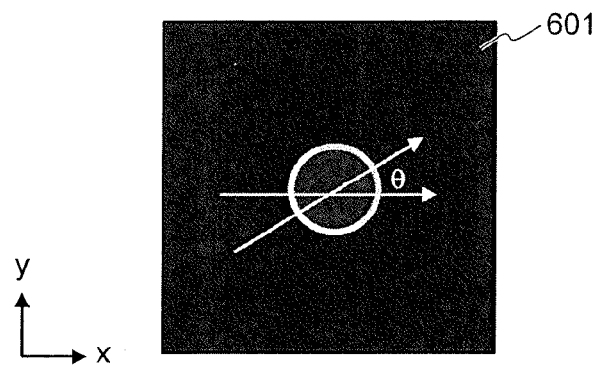
Figure 12C:
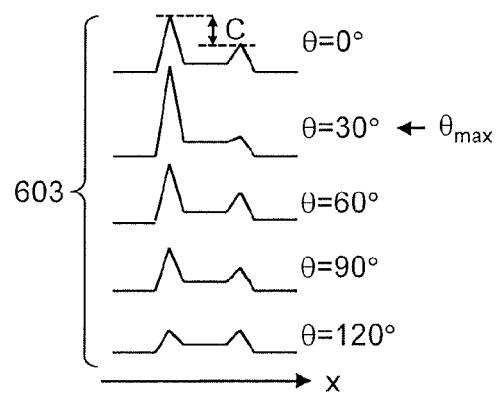

Next, a method for determining an optimum pore diameter to allow the "real" secondary electrons 1001 to pass through the pore of the reflector B 304 and cause most of the secondary electrons A 203, which impinge upon the reflector B 304, to become the backscattered electrons 1002 will be described. FIGS. 12A to 12C show a summary of the determination method. It should be noted that the method for determining an optimum pore diameter is performed by the image processing unit 324 or a control unit (not shown).

First, the image processing unit 324 applies a positive voltage to each of the first electrode 314 and the second electrode 315 to obtain a SEM image A 601 of a circular pattern with the first detector 313 (FIG. 12B). In such a case, the detection rate will differ depending on the difference in edge position, and thus, a difference in tone appears along the circumference of the circle as shown in FIG. 12B.

Next, the image processing unit 324 creates a line profile A 603 of the SEM image A 601 obtained by, provided that the angle of a direction that is horizontal with respect to the x direction is θ=0°, changing θ (FIG. 12C). When θ is changed, the heights of peaks that appear at the right edge and the left edge will also change.

Next, the image processing unit 324, in regard to the line profile A 603 created for each θ, determines the difference C in height between the right and left peaks, and determines θ at which C is the maximum (hereinafter referred to as $\theta_{max}$).

Next, the image processing unit 324 changes the pore diameter of the reflector B 304, and obtains the SEM image A 601 after the pore diameter is changed, and then determines $\theta_{max}$ for the obtained SEM image A 601 in accordance with the following procedures.

It should be noted that the "real" secondary electrons 1001 have a lower energy level than the backscattered electrons 1002, and thus have a characteristic that the trajectory of the "real" secondary electrons 1001 will greatly change in response to a change of the magnetic field around the objective lens 306 or the electrostatic charge of the pattern. Thus, when the pore diameter of the reflector B 304 is determined using a pattern that is not electrostatically charged, a plurality of SEM images A 601 are obtained for a given pore diameter by changing the incident energy level of the primary electron beam 201, and $\theta_{max}$ is determined for each SEM image A 601 to determine an optimum pore diameter. Meanwhile, when the pore diameter is determined using a pattern that is electrostatically charged, a plurality of SEM images A 601 are obtained for a given pore diameter by changing the scanning speed or the probe current of the primary electron beam 201, and $\theta_{max}$ is determined for each SEM image A 601 to determine an optimum pore diameter.

Figure 12D:
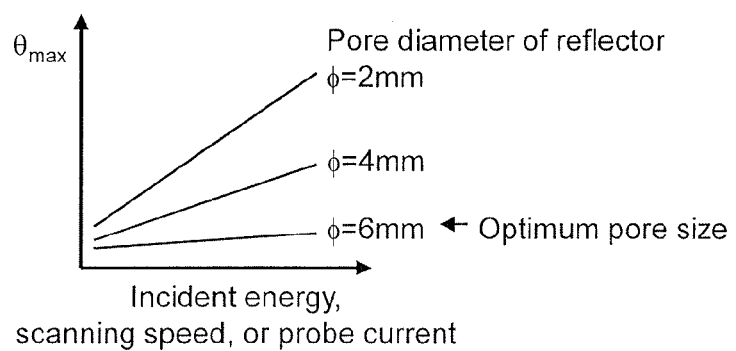

Specifically, as shown in FIG. 12D, $\theta_{max}$ that has been determined for each pore size φ (phi) of the reflector B 304 is converted into a graph where the x-axis indicates the incident energy, the scanning speed, or the probe current of the primary electron beam 201, and the y-axis indicates $\theta_{max}$. When most of the secondary electrons A 203, which impinge upon the reflector B 304, become the backscattered electrons 1002, a change in $\theta_{max}$ in response to a change in the incident energy, the scanning speed, or the probe current will be small. Thus, φ that is the closest to parallel with the x-axis is an optimum value as each pore diameter of the reflector B 304. In the example in FIG. 12D, φ=6 [mm] is the optimum.

In addition, the first detector 313, the first electrode 314, and the second electrode 315 are desirably installed at positions in a direction in which $\theta_{max}$ is 45°. This is because if $\theta_{max}$ is 0° or 90°, a shadow image of only one of the vertical or horizontal line patterns can be obtained, whereas if $\theta_{max}$ is 45°, a shadow image of each of the vertical and horizontal line patterns can be obtained.

Although the above example describes a case where an optimum pore diameter is determined by changing the incident energy, the scanning speed, or the probe current, it is also possible to control at least one of the distance between the reflector B 304 and the sample 307, the pore diameter of the reflector B 304, the level of the voltage VR (i.e., operating condition) applied by the retarding power supply 309, or the operating condition of the objective lens 306 (i.e., focusing lens) so as to allow, of the electrons generated from the sample, most of secondary electrons with energy that is less than or equal to 50 [eV] to pass through the pore of the reflector B 304 and allow most of electrons that impinge upon the reflector B 304 to become backscattered electrons with energy that is greater than or equal to 50 [eV] and less than or equal to the energy level of the primary electron beam 201.

Embodiment 4

The basic configuration of the pattern critical dimension measurement equipment in accordance with this embodiment is the same as the configuration of the pattern critical dimension measurement equipment shown in FIG. 3. However, the pattern critical dimension measurement equipment in accordance with this embodiment has mounted thereon a function of effectively discriminating a projection and a recess of a pattern even when the S/N ratio of the SEM image A 601 is low. The discrimination of a projection and a recess and the measurement of the pattern dimension described below are performed by the image processing unit 324.

FIG. 13 illustrates the processing procedures for discriminating a projection and a recess in accordance with this embodiment.

(Step 1301)

First, the image processing unit 324 applies a positive voltage to each of the first electrode 314 and the second electrode 315.

(Step 1302)

Next, the image processing unit 324 obtains a SEM image A 601 and a SEM image B 602 at the dimension measuring point. At this time, the SEM image A 601 and the SEM image B 602 are obtained through single scanning of the primary electron beam 201.

(Step 1303)

Next, the image processing unit 324 accumulates the brightness values of the SEM image B 602 in the y direction to create the line profile B 604. The first difference between this step and the discrimination of a projection and a recess described with reference to FIG. 5 is that the SEM image B 602 is used herein.

(Step 1304)

Next, the image processing unit 324 determines the x-coordinates of the peak positions of the line profile B 604. Although the line profile B 604 basically has no difference in height among the peaks corresponding to respective edges, the edge positions can be accurately identified. The second difference between this step and the discrimination of a projection and a recess described with reference to FIG. 5 is that the line profile B 604 used herein.

(Step 1305)

The image processing unit 324 determines the brightness of the SEM image A 601 at the x coordinates determined in the previous step. The processing target switches to the SEM image A 601 from this process, and the process returns back to the same process as the discrimination of a projection and a recess described with reference to FIG. 5.

(Step 1306)

When the first detector 313 has a configuration to generally detect the secondary electrons A 203 emitted on the left side of the pattern, the image processing unit 324 compares each brightness determined in step S1305 with one another, and discriminates a portion between two edges whose brightness is given by a combination of "low" to "high" when seen from the left to be a projection, and discriminates a portion between two edges whose brightness is given by a combination of "high" to "low" to be a recess.

It should be noted that when the first detector 313 has a configuration to generally detect the secondary electrons A 203 emitted on the right side of the pattern, the image processing unit 324 compares each brightness determined in step S1305 with one another, and discriminates a portion between two edges whose brightness is given by a combination of "high" to "low" when seen from the left to be a projection, and discriminates a portion between two edges whose brightness is given by a combination of "low" to "high" to be a recess.

(Step 1307)

After discriminating the projection and the recess, the image processing unit 324 measures the size of the projection or the recess using the SEM image B 602. The operator determines which size of the projection or the recess is to be measured on the basis of the results of the previous step.

According to the method disclosed in this embodiment, it is possible to discriminate a projection and a recess of a pattern by comparing the brightness at each pattern edge position with one another even when the S/N ratio of the SEM image A 601 is low, and measure the pattern size.

Embodiment 5

Figure 14:
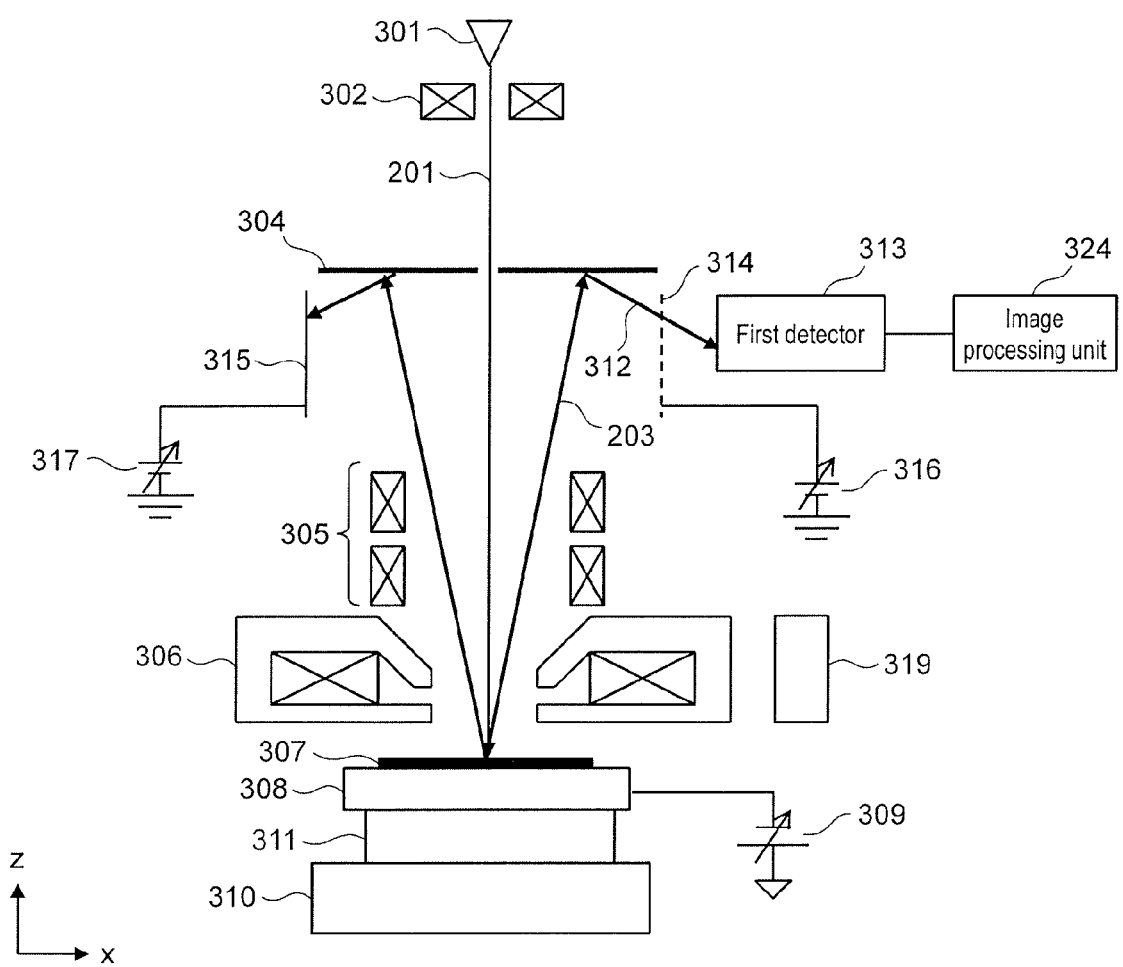
FIG. 14 is a diagram showing the schematic entire configuration of pattern critical dimension measurement equipment in accordance with Embodiment 5.

This embodiment will describe pattern critical dimension measurement equipment for discriminating a projection and a recess of a pattern and measuring the pattern dimension using only one detector, unlike in Embodiments 1 to 4 above. FIG. 14 shows the schematic configuration of pattern critical dimension measurement equipment in accordance with this embodiment. In FIG. 14, portions corresponding to those in FIG. 3 are denoted by the same reference numerals.

As understood from the comparison between FIG. 14 and FIG. 3, the pattern critical dimension measurement equipment in accordance with this embodiment has a configuration obtained by removing the reflector A 303, the second detector 318, the third electrode 321, the fourth electrode 322, and the electrode power supply C 323 from the pattern critical dimension measurement equipment with the configuration shown in FIG. 3. In this embodiment, it is impossible to detect the secondary electrons A 203 that have passed through the reflector B 304. Thus, the diameter of the pore formed in the reflector B 304 is set as small as possible. The elements shown in FIG. 14 execute similar operations to those shown in FIG. 3 except operations that are specific to this embodiment as described below.

In this embodiment, first, a positive voltage is applied to each of the first electrode 314 and the second electrode 315. At this time, secondary electrons B 312 generated on the right side of the reflector B 304 are pulled toward the first electrode 314, and finally reach the first detector 313. Meanwhile, the secondary electrons B 312 generated on the left side of the reflector B 304 are pulled toward the second electrode 315, and thus do not reach the first detector 313. That is, as there is a difference between the detection rates of the secondary electrons B 312 generated on the right and left sides of the reflector B 304, it is possible to acquire a shadow image (a SEM image with a shadow) from the first detector 313.

Next, a positive voltage is applied to the first electrode 314, while a ground potential or a negative voltage is applied to the second electrode 315. At this time, the secondary electrons B312 generated from each of the right and left sides of the reflector B304 are pulled toward the first electrode 314, and thus reach the first detector 313. Consequently, a SEM image of a top view of the pattern can be obtained with the first detector 313. The shadow image can be used to discriminate a projection and a recess of the pattern, while the SEM image of the top view can be used to measure the pattern dimension.

In this embodiment, the processes of discriminating a projection and a recess and measuring the pattern dimension are also executed by the image processing unit 324. When the pattern critical dimension measurement equipment in accordance with this embodiment is used, it would be impossible to implement the discrimination of a projection and a recess and the measurement of the pattern dimension through single scanning of the primary electrons 201 unlike in Embodiment 1 (that is, it is necessary to scan the same region twice). However, it is possible to perform the processes of discriminating a projection and a recess and measuring the pattern dimension using a single detector only by switching the voltage applied to the first electrode 314 and the second electrode 315. Therefore, using the pattern critical dimension measurement equipment in accordance with this embodiment allows a further reduction in the number of components and a significant reduction in the cost of the equipment as compared to the costs of the conventional equipment.

Other Embodiments

It should be noted that the present invention is not limited to the structures of the aforementioned embodiments, and includes a variety of variations. For example, the aforementioned embodiments are only some of embodiments described in detail to clearly illustrate the present invention. Thus, the present invention need not include all of the structures described in the embodiments. For example, the numerical values described in the aforementioned embodiments are only exemplary, and thus, the present invention is not limited to such numerical values. It is also possible to replace part of a structure of an embodiment with a structure of another embodiment. In addition, it is also possible to add, to a structure of an embodiment, a structure of another embodiment. Further, it is also possible to, for part of a structure of each embodiment, add/remove/substitute a structure of another embodiment.

Some or all of the aforementioned structures, functions, processing units, processing means, and the like may be implemented as an integrated circuit or other hardware, for example. Alternatively, each of the aforementioned structures, functions, and the like may be implemented through analysis and execution of a program that implements each function by a processor. That is, each of the aforementioned structures, functions, and the like may also be implemented as software. In such a case, information such as the program that implements each function, tables, and files can be stored in a storage device such as memory, a hard disk, or a SSD (Solid State Drive); or a storage medium such as an IC card, an SD card, or a DVD. In addition, the control lines and information lines represent those that are considered to be necessary for the description, and do not necessarily represent all control lines and information lines that are necessary for a product. Thus, in practice, almost all structures may be considered to be mutually connected.

DESCRIPTION OF SYMBOLS

101 Projection/Recess
102 SEM image
103 Line profile
201 Primary electron beam
202 Scanning route of primary electron beam
203 Secondary electrons A
204 Left detector
205 Right detector
301 Electron source
302 Anastigmatic aberration corrector
303 Reflector A
304 Reflector B
305 Deflector
306 Objective lens
307 Wafer
308 Wafer holder
309 Retarding power supply
310 Stage
311 Insulator
312 Secondary electrons B
313 First detector
314 First electrode
315 Second electrode
316 Electrode power supply A
317 Electrode power supply B
318 Second detector
319 Optical microscope
320 Secondary electrons C
321 Third electrode
322 Fourth electrode
323 Electrode power supply C
324 Image processing unit
601 SEM image A
602 SEM image B
603 Line profile A
604 Line profile B
801 Pore of reflector B
802 Arrival position of secondary electrons when incident energy level is low
803 Arrival position of secondary electrons when incident energy level is high
901 Sub-electrode A (first electrode 314)
902 Sub-electrode B (first electrode 314)
903 Sub-electrode C (first electrode 314)
904 Sub-electrode A (second electrode 315)
905 Sub-electrode B (second electrode 315)
906 Sub-electrode C (second electrode 315)
907 Switch A
908 Switch B
909 Switch C
910 Switch D
911 ExB Coil
1001 "Real" secondary electrons
1002 Backscattered electrons
1101 Pore diameter switching mechanism
1102 X-direction fine adjustment mechanism
1103 Y-direction fine adjustment mechanism

What is claimed is:

1. Pattern critical dimension measurement equipment comprising:
   an electron source configured to generate a primary electron beam;
   a deflector configured to deflect the primary electron beam emitted from the electron source;
   a focusing lens configured to focus the primary electron beam deflected by the deflector;
   a decelerator configured to decelerate the primary electron beam that irradiates a sample;
   a first detector located between the electron source and the focusing lens, the first detector being configured to detect electrons at part of azimuths of electrons generated from the sample upon irradiation of the sample with the primary electron beam; and
   a second detector located between the electron source and the first detector, the second detector being configured to detect electrons at substantially all azimuths of the electrons generated from the sample.

2. The pattern critical dimension measurement equipment according to claim 1, further comprising an image processor configured to perform a process of determining brightness of edges of a pattern formed on the sample on the basis of a first image obtained with the first detector, a process of discriminating a projection and a recess of the pattern on the basis of a change in brightness level between adjacent edges, and a process of measuring a size of the projection or the recess from a second image obtained with the second detector.

3. The pattern critical dimension measurement equipment according to claim 2, wherein the first detector, the first electrode, and the second electrode are arranged so as to allow a direction in which a difference in brightness between adjacent edges of a pattern contained in the first image obtained with the first detector is maximum to coincide with a direction that is rotated by 45° with respect to a scanning direction of the primary electron beam.

4. The pattern critical dimension measurement equipment according to claim 1, wherein
the first detector includes
a reflector with a reflecting plane and a pore, the reflecting plane being impinged upon by electrons generated from the sample, and the pore being configured to allow the primary electron beam to pass therethrough, and
a detection element configured to detect electrons generated from the reflector, and
the pattern critical dimension measurement equipment further comprises:
a first electrode located between the reflector and the detection element; and
a second electrode located on a side opposite to the first electrode with an optical axis of the primary electron beam interposed therebetween.

5. The pattern critical dimension measurement equipment according to claim 4, further comprising a mechanism for changing a diameter of the pore of the reflector.

6. The pattern critical dimension measurement equipment according to claim 5, further comprising a controller configured to control at least one of a distance between the reflector and the sample, the pore diameter of the reflector, an operating condition of the decelerator, or an operating condition of the focusing lens, thereby allowing, of the electrons generated from the sample, most of secondary electrons with energy that is less than or equal to 50 [eV] to pass through the pore of the reflector and allowing most of electrons that impinge upon the reflector to become backscattered electrons with energy that is greater than or equal to 50 [eV] and less than or equal to an energy level of the primary electron beam.

7. The pattern critical dimension measurement equipment according to claim 5, further comprising a controller configured to perform a process of obtaining a first image from the first detector while changing a combination of a pore diameter of the reflector and an incident energy level of the primary electron beam on the sample, a process of determining a direction in which a difference in brightness between adjacent edges of a pattern contained in the first image is maximum, and a process of setting the pore diameter of the reflector so as to minimize a change in the direction in which the difference in brightness that depends on the incident energy level is maximum.

8. The pattern critical dimension measurement equipment according to claim 5, further comprising a controller configured to execute a process of irradiating the sample formed of an insulator with the primary electron beam while changing a pore diameter of the reflector and changing a scanning speed or an irradiation current amount of the primary electron beam, a process of determining a direction in which a difference in brightness between adjacent edges of a pattern contained in the first image detected by the first detector is maximum, and a process of setting the pore diameter of the reflector so as to minimize a change in the direction in which the difference in brightness that depends on the scanning speed or the irradiation current amount of the primary electron beam is maximum.

9. The pattern critical dimension measurement equipment according to claim 4, further comprising:
a first voltage source configured to apply a voltage to the first electrode;
a second voltage source configured to apply a voltage to the second electrode; and
a controller configured to individually control the voltages applied to the first and second electrodes.

10. The pattern critical dimension measurement equipment according to claim 4, further comprising a controller configured to change a preset value of an astigmatic aberration corrector configured to correct astigmatic aberrations of the primary electron beam in accordance with a level of a voltage applied to the first electrode or the second electrode.

11. The pattern critical dimension measurement equipment according to claim 4, further comprising:
a first voltage source configured to selectively apply a voltage to a plurality of sub-electrodes of the first electrode;
a second voltage source configured to selectively apply a voltage to a plurality of sub-electrodes of the second electrode; and
a controller configured to individually control the voltages applied to the first and second electrodes for each incident condition of the primary electron beam.

12. The pattern critical dimension measurement equipment according to claim 1, further comprising an image processor configured to execute a process of determining edge positions of a pattern formed on the sample on the basis of a second image obtained with the second detector, a process of determining brightness at the edge positions in a first image obtained with the first detector, a process of discriminating a projection and a recess of the pattern on the basis of a change in brightness level between adjacent edges, and a process of measuring a size of the projection or the recess on the basis of the second image obtained with the second detector.

13. A pattern critical dimension measurement equipment comprising:
an electron source configured to generate a primary electron beam;
a deflector configured to deflect the primary electron beam emitted from the electron source;
a focusing lens configured to focus the primary electron beam deflected by the deflector;
a decelerator configured to decelerate the primary electron beam that irradiates a sample;
a reflector located between the electron source and the focusing lens, the reflector being impinged upon by electrons generated from the sample upon irradiation of the sample with the primary electron beam;
a first detector configured to detect electrons generated by the reflector;
a first electrode located between the reflector and the first detector;

a second electrode located on a side opposite to the first electrode with an optical axis of the primary electron beam interposed therebetween; and a controller configured to control levels of respective voltages applied to the first electrode and the second electrode, thereby controlling a detection rate of electrons generated by the reflector.

14. The pattern critical dimension measurement equipment according to claim 13, further comprising a controller configured to perform a process of discriminating a projection and a recess of the sample on the basis of a first image obtained with the first detector when a positive voltage is applied to each of the first electrode and the second electrode, and a process of measuring a size of the projection or the recess from a second image obtained with the first detector when a positive voltage is applied to the first electrode and a ground potential or a negative voltage is applied to the second electrode.

15. A method for measuring a critical dimension of a pattern formed on a sample using a pattern critical dimension measurement equipment, wherein the pattern critical dimension measurement equipment includes an electron source configured to generate a primary electron beam, a deflector configured to deflect the primary electron beam emitted from the electron source, a focusing lens configured to focus the primary electron beam deflected by the deflector, a decelerator configured to decelerate the primary electron beam that irradiates the sample, a first detector located between the electron source and the focusing lens, the first detector being configured to detect electrons at part of azimuths of electrons generated from the sample upon irradiation of the sample with the primary electron beam, a second detector located between the electron source and the first detector, the second detector being configured to detect electrons at substantially all azimuths of the electrons generated from the sample, and an image processor configured to execute a process of measuring a dimension of the pattern, the method comprising the following processes performed by the image processor:

a process of determining brightness of edges of a pattern formed on the sample on the basis of a first image obtained with the first detector;

a process of discriminating a projection and a recess of the pattern on the basis of a change in brightness level between adjacent edges; and a process of measuring a size of the projection or the recess from a second image obtained with the second detector.

16. The method according to claim 15, wherein the first detector includes a reflector with a reflecting plane and a pore, the reflecting plane being impinged upon by electrons generated from the sample, and the pore being configured to allow the primary electron beam to pass therethrough, and also includes a detection element configured to detect electrons generated from the reflector, and the method further comprises a process of, when the pattern critical dimension measurement equipment includes a first electrode located between the reflector and the detection element, a second electrode located on a side opposite to the first electrode with an optical axis of the primary electron beam interposed therebetween, a first voltage source configured to selectively apply a voltage to a plurality of sub-electrodes of the first electrode, and a second voltage source configured to selectively apply a voltage to a plurality of sub-electrodes of the second electrode, individually controlling the voltages applied to the first and second electrodes for each incident condition of the primary electron beam.

17. The method according to claim 15, further comprising, when the first detector further includes a reflector with a reflecting plane and a pore, the reflecting plane being impinged upon by electrons generated from the sample, and the pore being configured to allow the primary electron beam to pass therethrough, and a detection element configured to detect electrons generated from the reflector, and the pattern critical dimension measurement equipment further includes a first electrode located between the reflector and the detection element, a second electrode located on a side opposite to the first electrode with an optical axis of the primary electron beam interposed therebetween, and a mechanism for changing a diameter of the pore of the reflector, a process of controlling at least one of a distance between the reflector and the sample, a pore diameter of the reflector, an operating condition of the decelerator, or an operating condition of the focusing lens, thereby allowing, of the electrons generated from the sample, most of secondary electrons with energy that is less than or equal to 50 [eV] to pass through the pore of the reflector and allowing most of electrons that impinge upon the reflector to become backscattered electrons with energy that is greater than or equal to 50 [eV] and less than or equal to an energy level of the primary electron beam.

18. The method according to claim 15, further comprising:

a process of determining edge positions of a pattern formed on the sample on the basis of a second image obtained with the second detector;

a process of determining brightness at the edge positions in the first image obtained with the first detector;

a process of discriminating a projection and a recess of the pattern on the basis of a change in brightness level between adjacent edges, and a process of measuring a size of the projection or the recess from the second image obtained with the second detector.

19. The method according to claim 15, further comprising, when the first detector includes a reflector with a reflecting plane and a pore, the reflecting plane being impinged upon by electrons generated from the sample, and the pore being configured to allow the primary electron beam to pass therethrough, and a detection element configured to detect electrons generated from the reflector, and the pattern critical dimension measurement equipment further includes a first electrode located between the reflector and the detection element, a second electrode located on a side opposite to the first electrode with an optical axis of the primary electron beam interposed therebetween, and a mechanism for changing a diameter of the pore of the reflector:

a process of obtaining a first image from the first detector by changing a combination of a pore diameter of the reflector and an incident energy level of the primary electron beam on the sample;

a process of determining a direction in which a difference in brightness between adjacent edges of a pattern contained in the first image is maximum; and a process of setting the pore diameter of the reflector so as to minimize a change in the direction in which the difference in brightness that depends on the incident energy level is maximum.

20. The method according to claim 15, further comprising, when the first detector includes a reflector with a reflecting plane and a pore, the reflecting plane being impinged upon by electrons generated from the sample, and the pore being configured to allow the primary electron beam to pass therethrough, and a detection element configured to detect electrons generated from the reflector, and the pattern critical dimension measurement equipment further includes a first electrode located between the reflector and the detection element, a second electrode located on a side opposite to the first electrode with an optical axis of the primary electron beam interposed therebetween, and a mechanism for changing a diameter of the pore of the reflector:

a process of irradiating the sample formed of an insulator with the primary electron beam while changing a pore diameter of the reflector or changing a scanning speed or an irradiation current amount of the primary electron beam;

a process of determining a direction in which a difference in brightness between adjacent edges of a pattern contained in the first image obtained with the first detector is maximum; and a process of setting the pore diameter of the reflector so as to minimize a change in the direction in which the difference in brightness that depends on the scanning speed or the irradiation current amount of the primary electron beam is maximum.

\* \* \* \* \*